United States Patent
Sekar et al.

(10) Patent No.: US 11,152,062 B2
(45) Date of Patent: *Oct. 19, 2021

(54) 1T-1R ARCHITECTURE FOR RESISTIVE RANDOM ACCESS MEMORY

(71) Applicant: HEFEI RELIANCE MEMORY LIMITED, Hefei (CN)

(72) Inventors: Deepak Chandra Sekar, San Jose, CA (US); Wayne Frederick Ellis, Jericho Center, VT (US)

(73) Assignee: Hefei Reliance Memory Limited, Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/008,505

(22) Filed: Aug. 31, 2020

(65) Prior Publication Data

US 2020/0395068 A1 Dec. 17, 2020

Related U.S. Application Data

(63) Continuation of application No. 16/514,031, filed on Jul. 17, 2019, now Pat. No. 10,783,964, which is a
(Continued)

(51) Int. Cl.
*G11C 13/00* (2006.01)
*G11C 5/06* (2006.01)
(Continued)

(52) U.S. Cl.
CPC ........ *G11C 13/004* (2013.01); *G11C 11/1659* (2013.01); *G11C 11/1673* (2013.01); *G11C 11/1675* (2013.01); *G11C 13/0002* (2013.01); *G11C 13/003* (2013.01); *G11C 13/0069* (2013.01); *G11C 13/0097* (2013.01); *G11C 5/02* (2013.01); *G11C 5/06* (2013.01); *G11C 2013/0071* (2013.01);
(Continued)

(58) Field of Classification Search
CPC ............ G11C 13/0069; G11C 13/0002; G11C 13/003; G11C 5/06; G11C 5/02
USPC ........................................... 365/148, 51, 63
See application file for complete search history.

(56) References Cited

U.S. PATENT DOCUMENTS 8,279,654 B2   10/2012   Otsuka
8,289,749 B2   10/2012   Chen et al.
(Continued)

*Primary Examiner* — Ly D Pham
(74) *Attorney, Agent, or Firm* — Sheppard Mullin Richter & Hampton LLP

(57) ABSTRACT

A memory device comprises: an array of memory cells arranged in a plurality of columns in a first direction and a plurality of rows in a second direction, wherein each memory cell in the array comprises: a select transistor, wherein a source terminal of the select transistor is coupled to a source line, and wherein a gate terminal of the select transistor is coupled to a word line, and a memory element coupled in series with the select transistor, wherein a first end of the memory element is coupled to a drain terminal of the select transistor, and wherein a second end of the memory element is coupled to a bit line; and a control circuit configured to provide an unselected source line voltage to source lines of unselected memory cells before providing a selected word line voltage to a word line of a selected memory cell.

20 Claims, 12 Drawing Sheets

Related U.S. Application Data continuation of application No. 15/817,887, filed on Nov. 20, 2017, now Pat. No. 10,388,372, which is a continuation of application No. 15/206,616, filed on Jul. 11, 2016, now Pat. No. 9,824,752, which is a continuation of application No. 14/567,988, filed on Dec. 11, 2014, now Pat. No. 9,390,798.

(60) Provisional application No. 62/050,326, filed on Sep. 15, 2014.

(51) Int. Cl.
*G11C 5/02* (2006.01)
*G11C 11/419* (2006.01)
*G11C 11/16* (2006.01)

(52) U.S. Cl.
CPC .. *G11C 2013/0088* (2013.01); *G11C 2213/79* (2013.01); *G11C 2213/82* (2013.01)

(56) References Cited

U.S. PATENT DOCUMENTS

| | | |
|---|---|---|
| 8,324,607 B2 | 12/2012 | Rolbiecki et al. |
| 8,649,206 B2 | 2/2014 | Scheuerlein |
| 8,817,521 B2 | 8/2014 | Chen et al. |
| 9,390,798 B2 | 7/2016 | Sekar et al. |
| 9,824,752 B2 | 11/2017 | Sekar et al. |
| 10,388,372 B2 | 8/2019 | Sekar et al. |
| 2004/0114428 A1 | 6/2004 | Morikawa |
| 2007/0127302 A1 | 6/2007 | Okamoto et al. |
| 2007/0159870 A1 | 7/2007 | Tanizaki et al. |
| 2012/0069626 A1 | 3/2012 | Nakano et al. |
| 2012/0155146 A1 | 6/2012 | Ueda et al. |
| 2012/0223284 A1 | 9/2012 | Tamai |
| 2013/0155763 A1 | 6/2013 | Alam et al. |
| 2013/0329484 A1 | 12/2013 | Tamai et al. |
| 2014/0036573 A1 | 2/2014 | Ishihara et al. |
| 2014/0133211 A1 | 5/2014 | Nazarian et al. |
| 2014/0365723 A1 | 12/2014 | Oh et al. |
| 2016/0078934 A1* | 3/2016 | Sekar ............... G11C 11/1675 365/148 |

* cited by examiner

Fig. 8A
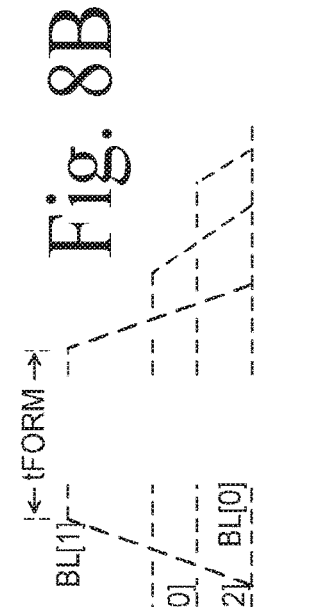
1. Charge Unselected SL[1] to e.g., 2V
   - Hold Selected SL[0] = 0V
2. Charge Selected WL[1,0] to Vmirror
   - Hold Unselected WL[3,2] = 0V
3. Charge Selected BL[0] to $V_{Form}$ e.g., 3.5V
   - Hold Unselected BL[1] = 0V
4. IHold voltages in steps 1-3 for duration of form operation tFORM
   (Bit cells at WL0,1 – BL1)
5. Discharge Selected BL[0]
6. Discharge Unselected SL[1]
7. Discharge Selected WL[1,0]
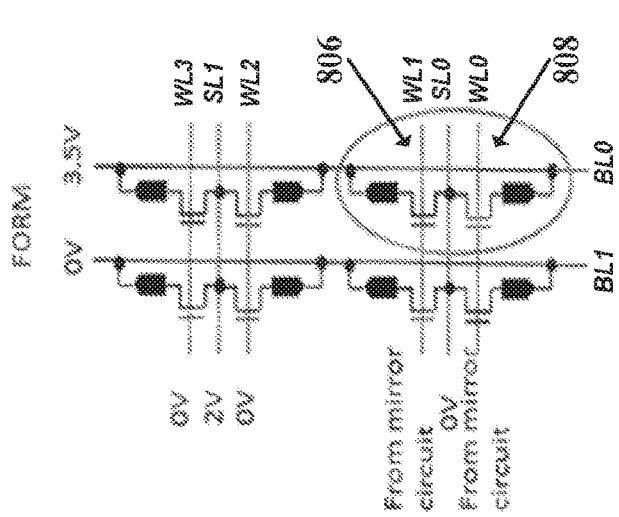
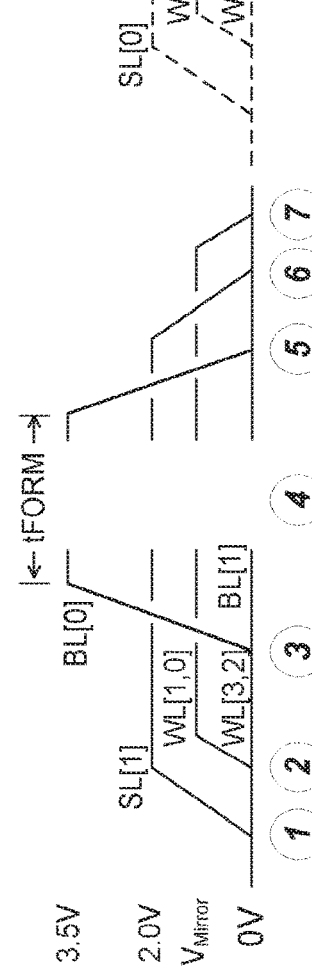
Fig. 8B

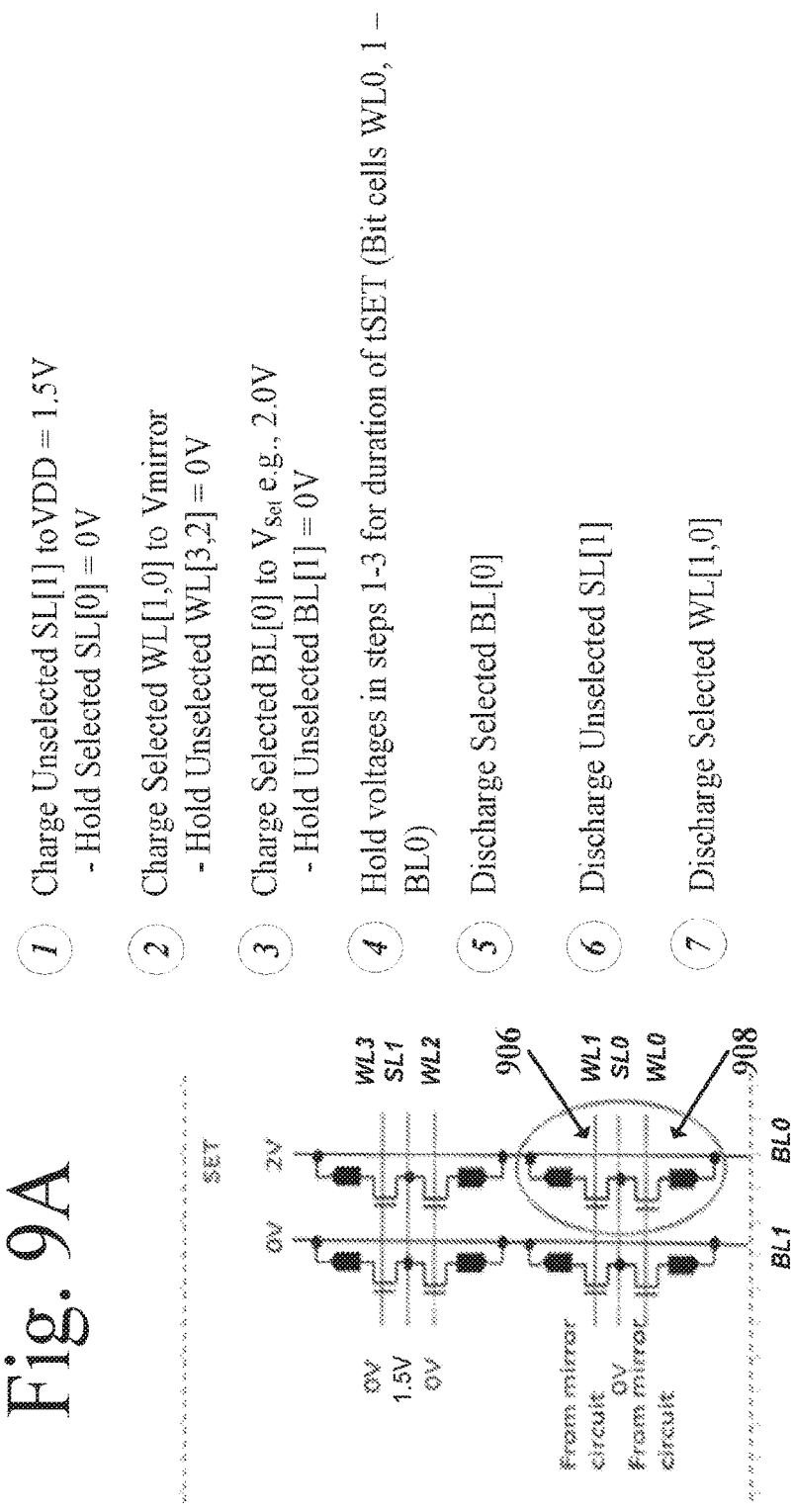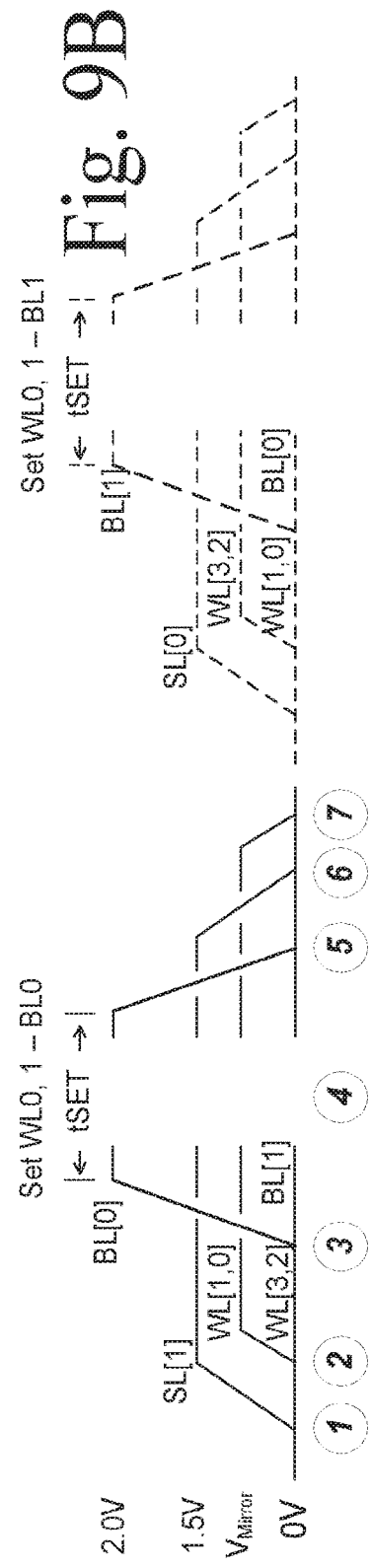
Fig. 9A
Fig. 9B
① Charge Unselected SL[1] to VDD = 1.5V - Hold Selected SL[0] = 0V
② Charge Selected WL[1,0] to Vmirror - Hold Unselected WL[3,2] = 0V
③ Charge Selected BL[0] to $V_{Set}$ e.g., 2.0V - Hold Unselected BL[1] = 0V
④ Hold voltages in steps 1-3 for duration of tSET (Bit cells WL0, 1 – BL0)
⑤ Discharge Selected BL[0]
⑥ Discharge Unselected SL[1]
⑦ Discharge Selected WL[1,0]

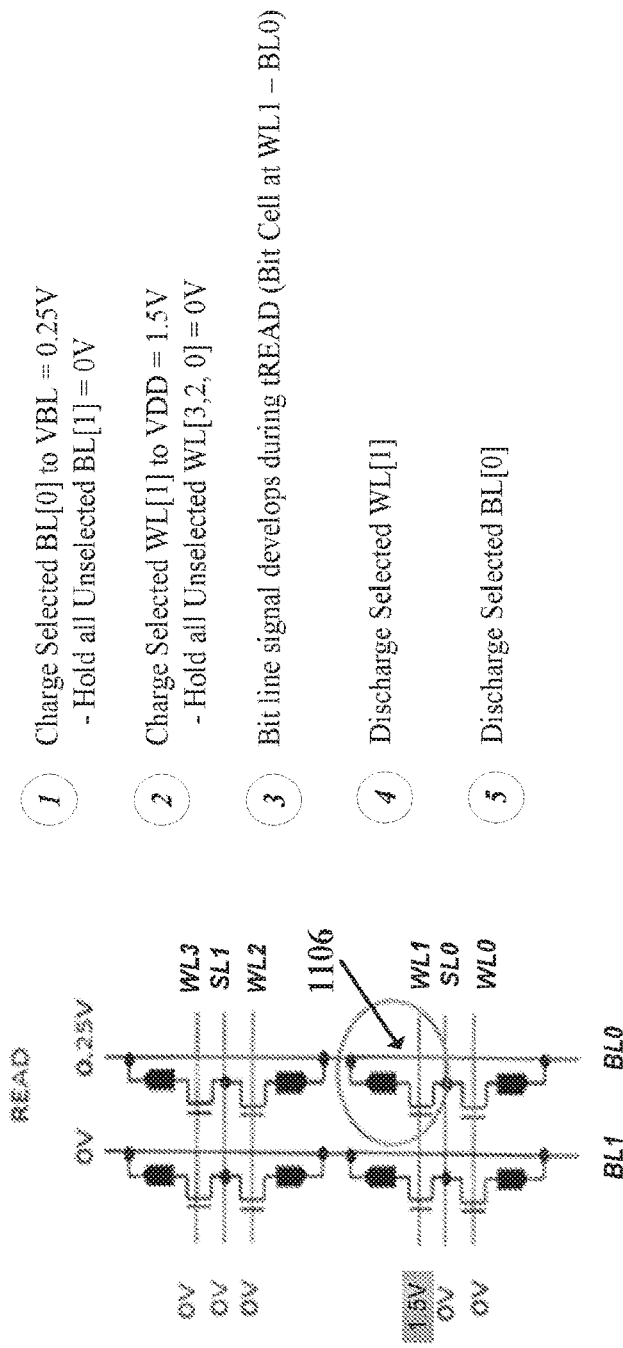
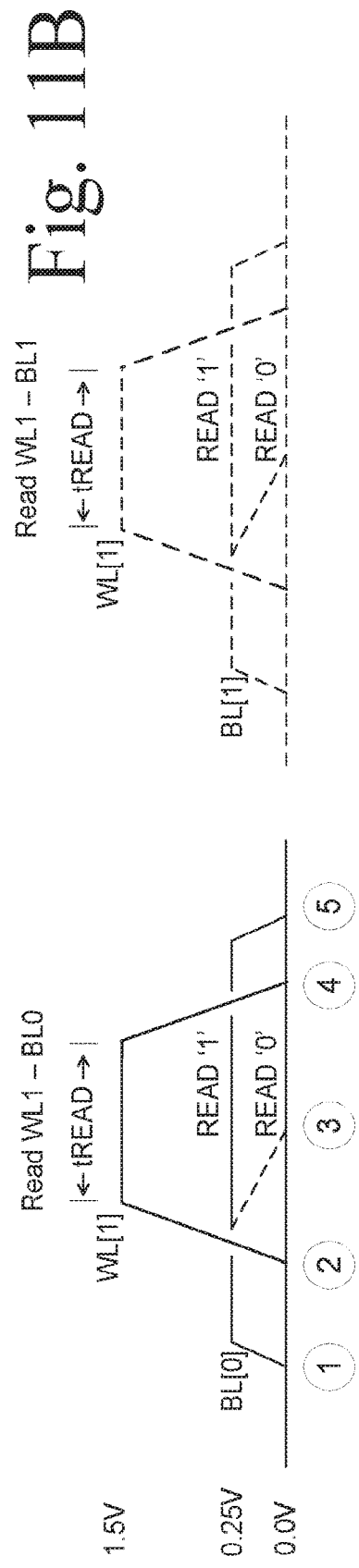
Fig. 11A
Fig. 11B

1T-1R ARCHITECTURE FOR RESISTIVE RANDOM ACCESS MEMORY

RELATED APPLICATIONS

The present application is a continuation of U.S. patent application Ser. No. 16/514,031, filed on Jul. 17, 2019, which is a continuation of U.S. patent application Ser. No. 15/817,887, filed on Nov. 20, 2017, now U.S. Pat. No. 10,388,372, which is a continuation of U.S. patent application Ser. No. 15/206,616, filed on Jul. 11, 2016, now U.S. Pat. No. 9,824,752, which is a continuation of U.S. patent application Ser. No. 14/567,988, filed on Dec. 11, 2014, now U.S. Pat. No. 9,390,798, titled "1T-1R ARCHITECTURE FOR RESISTIVE RANDOM ACCESS MEMORY", which claims priority to U.S. Provisional Patent Application No. 62/050,326, filed on Sep. 15, 2014, titled "CIRCUIT AND ARCHITECTURE SOLUTIONS FOR A 1TRANSISTOR-1RESISTOR CELL RRAM". The above-referenced applications are incorporated herein by reference in their entirety.

TECHNICAL FIELD

The present disclosure relates to semiconductor memory and, more particularly, to resistive random access memory (RRAM) with a one transistor, one resistive element (1T-1R) memory cell architecture.

BACKGROUND

Non-volatile memory devices that retain stored data in the absence of power are pervasively used in consumer electronic products including cell phones, tablets, personal computers, personal digital assistants, and the like. Unfortunately, many non-volatile memory devices have limitations that make them unsuitable for use as primary storage for these products including higher cost and lower performance when compared to volatile memory devices such as dynamic random access memory (DRAM). Examples of older technology non-volatile memory devices include read-only memory (ROM) and flash memory. Examples of newer technology non-volatile memory devices include resistive random access memory (RRAM), phase change memory (PCM), spin-transfer torque magneto resistive random access memory (STT-MRAM), ferroelectric random access memory (FRAM), and many others.

RRAM operates on the basis that a typically insulating dielectric may be made to conduct through formation of a conduction path or filament upon application of a sufficiently high voltage. Formation of the conduction path may occur through different mechanisms, including defects and metal migration. Once the conduction path or filament forms, the filament may be reset (broken, resulting in high resistance) or set (reformed, resulting in lower resistance) by an appropriately applied voltage. Recent data suggests that the conduction path may include many conduction paths, rather than a single path through a single filament. RRAM devices including conductive bridge RAM (CBRAM) and transition metal oxide RRAM are a focal point for current development. In CBRAM devices, metal filaments between two electrodes form the conduction path, where one of the electrodes participates in the reaction. In transition metal oxide RRAM, oxygen vacancy filaments in a transition metal such as hafnium oxide or tantalum oxide form the conduction path.

RRAM devices used in consumer and communication applications may be required to retain data for 10 years at 85 degrees. In contrast, RRAM devices used in industrial and automotive applications may be required to retain data for 10 years at 125°. Further, RRAM devices used in consumer and communication applications often do not have the speed and processing requirements of RRAM devices used in industrial and automotive applications, which allows for simpler cell architectures capable of manufacture using conventional processing technologies. As such, RRAM devices with 1T-1R memory cell architectures may be attractive for use in consumer and communication applications.

BRIEF DRAWINGS DESCRIPTION

The present disclosure describes various embodiments that may be understood and fully appreciated in conjunction with the following drawings:

FIG. 3B is a diagram illustrating an embodiment of a method of operating a portion of a 1T-1R memory array to address punch-through;

FIG. 8A is a diagram of an embodiment of a voltage signal sequence applied to a portion of a 1T-1R memory array during a form operation;

FIG. 8B is a timing diagram of an embodiment of the voltage signal sequence applied to the portion of the 1T-1R memory array shown in FIG. 8A during the form operation;

FIG. 9A is a diagram of an embodiment of a voltage signal sequence applied to a portion of a 1T-1R memory array during a set operation;

FIG. 9B is a timing diagram of an embodiment of the voltage signal sequence applied to the portion of the 1T-1R memory array shown in FIG. 9A during the set operation;

FIG. 11A is a diagram of an embodiment of a voltage signal sequence applied to a portion of a 1T-1R memory array during a read operation;

FIG. 11B is a timing diagram of an embodiment of the voltage signal sequence applied to the portion of the 1T-1R memory array shown in FIG. 10A during the read operation.

DETAILED DESCRIPTION

Figure 1:
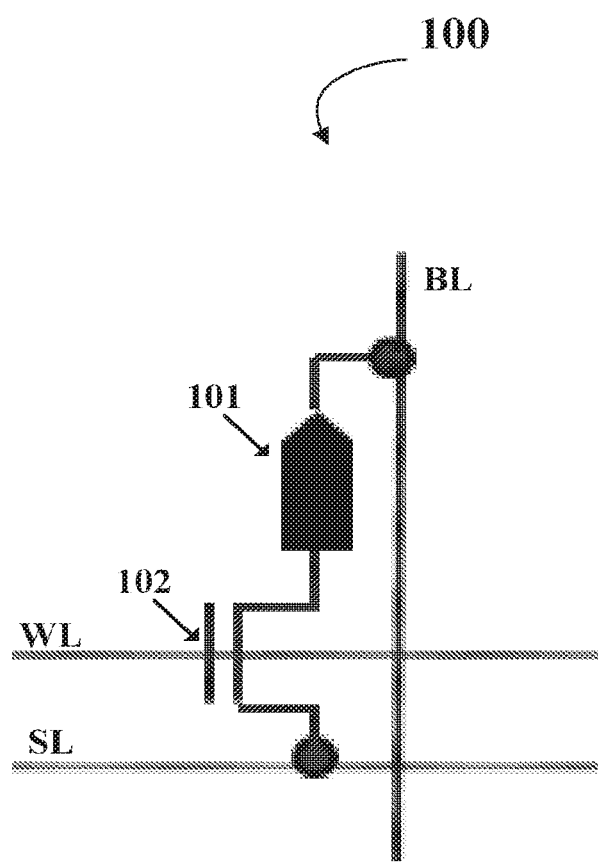
FIG. 1 is a diagram of an embodiment of a 1T-1R memory cell.

The present disclosure describes embodiments with reference to the drawing figures listed above. Persons of ordinary skill in the art will appreciate that the description and figures illustrate rather than limit the disclosure and that, in general, the figures are not drawn to scale for clarity of presentation. Such skilled persons will also realize that many more embodiments are possible by applying the inventive principles contained herein and that such embodiments fall within the scope of the disclosure which is not to be limited except by the claims.

Referring to FIG. 1, a 1T-1R memory cell 100 includes a memory element 101 electrically coupled in series to a select transistor 102 at a first end and coupled to a bit line terminal receiving a bit line signal BL at a second end. Select transistor 102 receives a word line signal WL at a gate and a source line signal SL at a source. Memory cell 100 may operate in response to bit line signal BL, word line signal WL, and source line signal SL.

Memory element 101 may include any kind of memory technology known to a person of ordinary skill in the art that changes resistance as a function of applied voltage or current, e.g., Resistive Random Access Memory (RRAM), Phase Change Memory (PCM), Spin-Transfer Torque Magnetic Random Access Memory (STT-MRAM), and the like.

Figure 2:
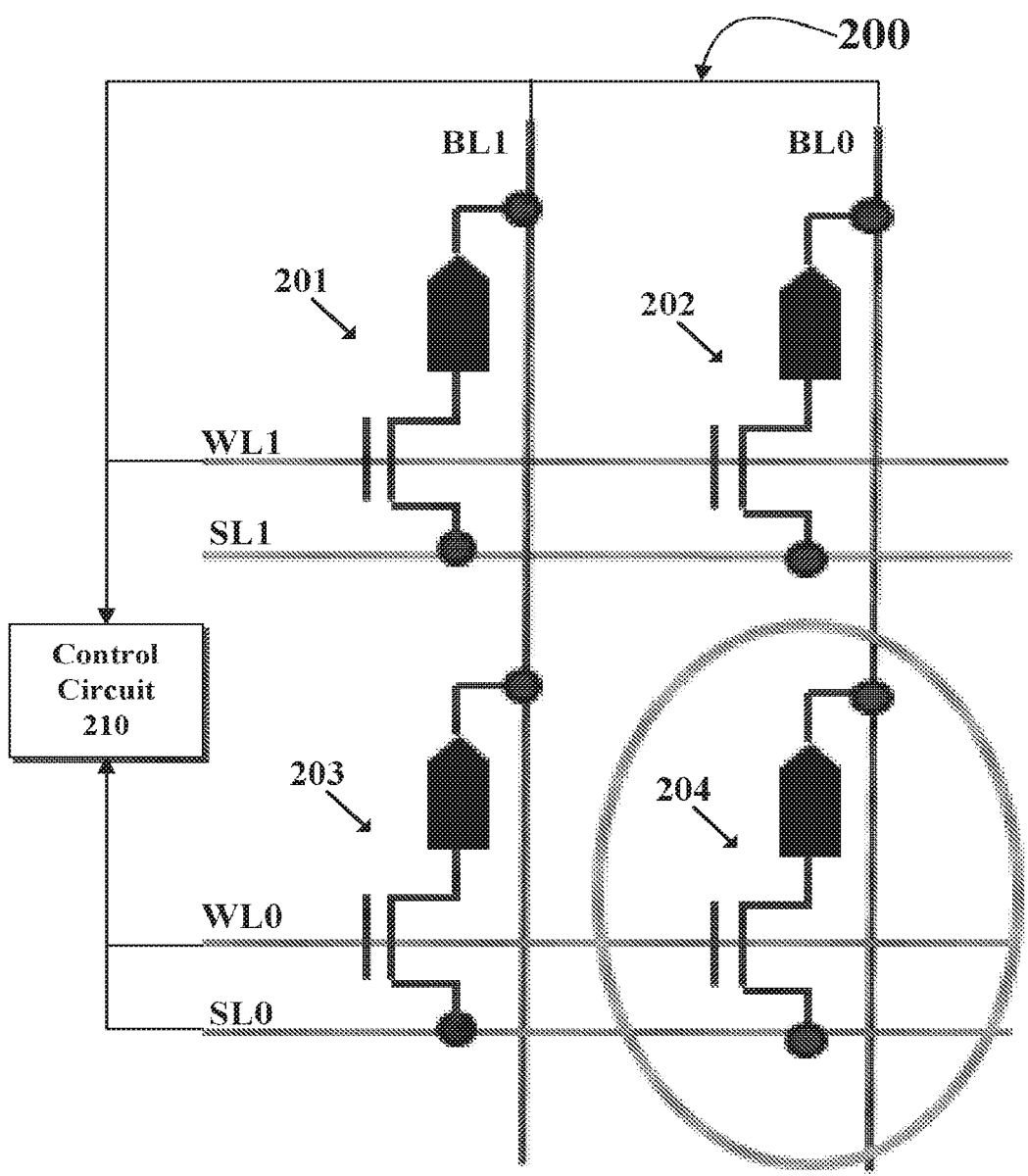
FIG. 2 is a diagram of an embodiment of a portion of a 1T-1R memory array.

FIG. 2 is a diagram of a portion of a 1T-1R memory array 200 including a plurality of memory cells, e.g., cells 201, 202, 203, and 204, arranged in a plurality of columns extending in a first direction and a plurality of rows extending in a second direction typically perpendicular to the first direction. Memory cells 201, 202, 203, and 204 may have a construction similar to that of memory cell 100 shown in FIG. 1. As with memory cell 100, each of memory cells 201, 202, 203, and 204 is coupled to receive a bit line signal, e.g., BL0 or BL1, word line signal, e.g., WL0 or WL1, and source line signal, e.g., SL0 or SL1. Memory cells 201, 202, 203, and 204 may include any type of memory technology known to a person of ordinary skill in the art that changes resistance as a function of applied voltage or current, e.g., RRAM, PCM, STT-MRAM, and the like.

In an embodiment of array 200, a column of memory cells is coupled to receive a common bit line signal while a row of memory cells is coupled to receive a common word line signal and a common source line signal. For example, memory cells 201 and 203 arranged on a first column commonly receive a first bit line signal BL0 while memory cells 202 and 204 arranged on a second column commonly receive a second bit line signal BL1. Memory cells 201 and 202 arranged on a first row commonly receive a first word line signal WL1 at corresponding gates and receive a first source line signal SL1 at corresponding sources. Likewise, memory cells 203 and 204 arranged on a second row commonly receive a second word line signal WL0 at corresponding gates and receive a second source line signal SL0 at corresponding sources.

In an embodiment, a control circuit 210 may generate voltage signals necessary to operate memory array 200 including bit line signals BL0 or BL1, word line signals WL0 or WL1 and source line signals SL0 or SL1, as is well known to a person of ordinary skill in the art. In an embodiment, control circuit 210 avoids voltage or high current stresses on the memory cells, e.g., memory cells 201, 202, 203, and 204 that would result in damage, wear out, reduced life, or the like, by applying the necessary voltage signals in predetermined levels and/or in a predetermined sequence as further described below.

Figure 3A:
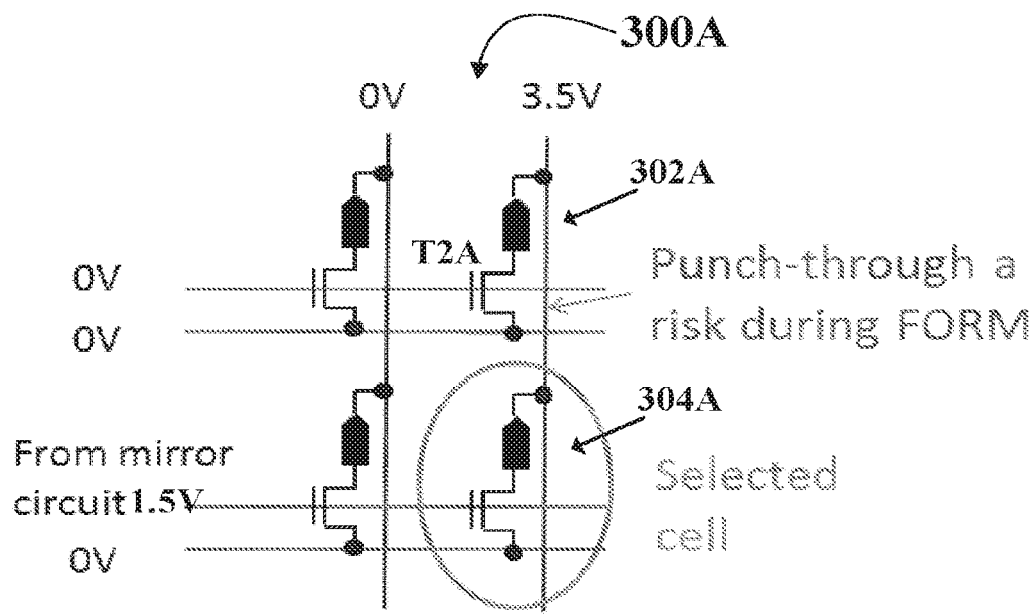
FIG. 3A is a diagram illustrating punch-through in a portion of a 1T-1R memory array.

FIG. 3A is a diagram illustrating punch-through in a portion of a 1T-1R memory array 300A. Punch-though refers to a situation in which the depletion layers around the drain and source regions of a transistor, e.g., select transistor T2A of memory cell 302A, merge into a single depletion region due to voltage overstress. The field underneath the gate of select transistor T2A then becomes strongly dependent on the drain-source voltage, as is the drain current. Punch through may cause a rapidly increasing current with increasing drain-source voltage, an effect that is undesirable as it may degrade the reliability of memory array 300A, may increase power requirements due to leakage currents in unselected cells, and may necessitate larger select transistors to avoid the problem among other undesirable issues.

Memory array 300A has all of its unselected source lines, e.g., SL1, biased at ground during a form operation. During the form operation of selected cell 304A, a voltage often greater than 3.5V may be applied to the selected bit line signal BL0, which, in turn, may cause punch-through for unselected cells, e.g., memory cell 302A, coupled to bit line signal BL0 since the voltage across the source and drain region is high at 3.5V.

Figure 3B:
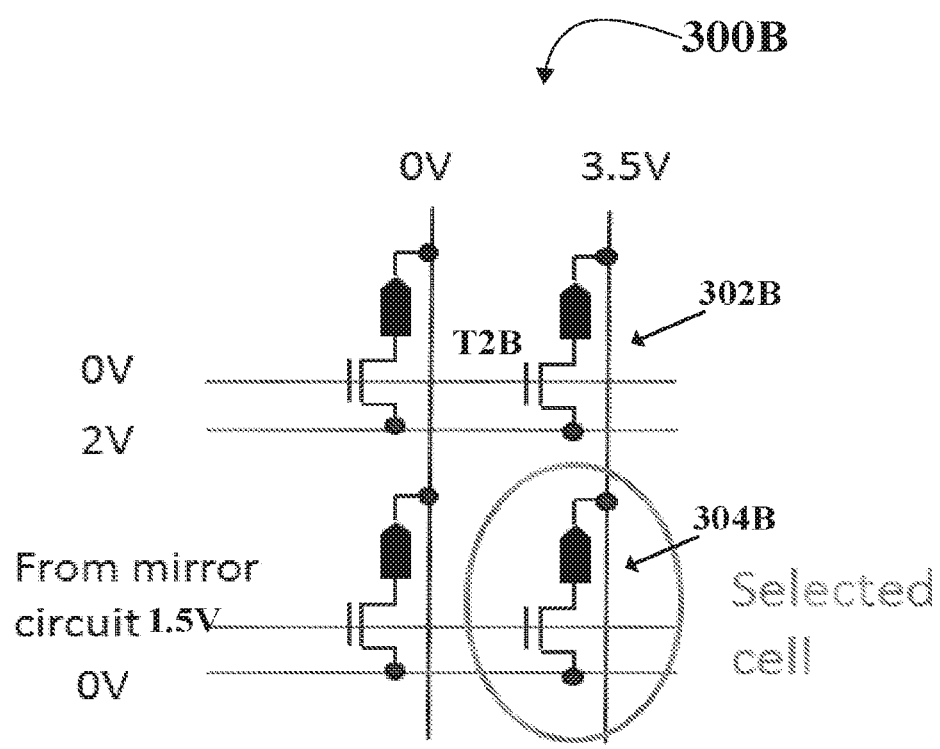

FIG. 3B is a diagram illustrating an embodiment of a method of operating a portion of a 1T-1R memory array 300B to avoid the undesirable punch-through failure shown in FIG. 3A. An exemplary bias scheme in which a memory cell 304B is selected for a form operation is shown in Table 1.

TABLE 1

| Form Operation | | |
| --- | --- | --- |
| Selected bit line signal | BL0 | 3.5 V |
| Selected source line signal | SL0 | 0 V |
| Selected word line signal | WL0 | 1.5 V |
| Unselected bit line signal | BL1 | 0 V |
| Unselected source line signal | SL1 | 2 V |
| Unselected word line signal | WL1 | 0 V |

Punch-through of select transistor T2B of unselected memory cell 302B is avoided by biasing unselected source lines, e.g., SL1, at a voltage that is higher than ground and less than the selected bit line signal voltage BL1 of 3.5V. For example, punch-though of select transistor T2B is avoided by biasing unselected source line signals SL1 at an intermediate voltage of 2V. A person of skill in the art should recognize that unselected source lines may be biased at many other voltages higher than ground and less than the selected bit line signal voltage depending on various design parameters associated with memory array 300B to avoid punch-through of select transistors of unselected memory cells during form operations of selected memory cells.

Figure 4:
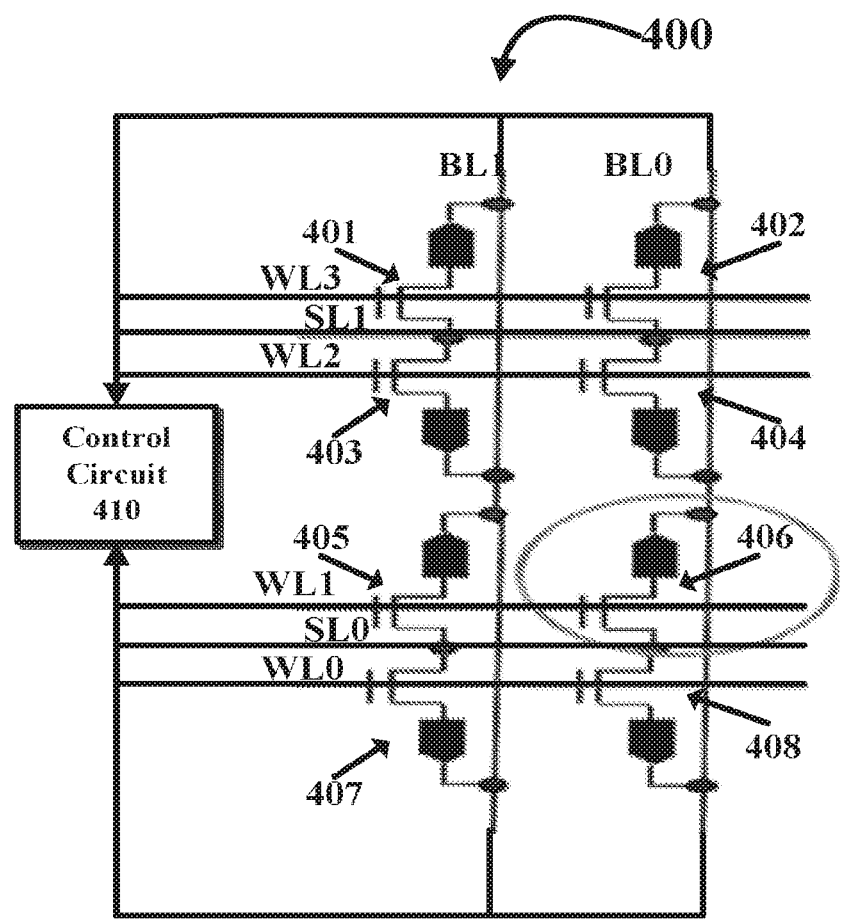
FIG. 4 is a diagram of an embodiment of a portion of a 1T-1T memory array.

FIG. 4 is a diagram of an embodiment of a portion of a 1T-1R memory array 400 in which memory cells positioned on adjacent rows are electrically coupled to a common source line. Memory array 400 may include a plurality of memory cells, e.g., cells 401, 402, 403, 404, 405, 406, 407, and 408, arranged in a plurality of columns extending in a first direction and a plurality of rows extending in a second direction perpendicular to the first direction. For example, memory cells 401 and 402 extend in a first row horizontally while memory cells 401, 403, 405, and 407 extend in a first column vertically.

Memory cells 401, 402, 403, 404, 405, 406, 407, and 408 may have a construction similar to that of memory cell 100 shown in FIG. 1. As with memory cell 100, each of memory cells 401, 402, 403, 404, 405, 406, 407, and 408 is coupled to receive a bit line signal, e.g., BL0 or BL1, a word line signal, e.g., WL0, WL1, WL2, or WL3, and a source line signal, e.g., SL0 or SL1. In an embodiment, a control circuit 410 may generate voltage signals necessary to operate memory array 400 including bit line signals BL0 and BL1, word line signals WL0, WL1, WL2, and WL3, and source line signals SL0 and SL1, as is well known to a person of ordinary skill in the art. In an embodiment, control circuit 410 avoids voltage or high current stresses on the memory cells, e.g., memory cells 401, 402, 403, 404, 405, 406, 407, and 408 that would result in damage, wear out, reduced life, or the like, by applying the necessary voltage signals in predetermined levels and/or in a predetermined sequence as further described below.

In an embodiment of memory array 400, a column of memory cells is coupled to receive a common bit line signal while a row of memory cells is coupled to receive a common word line signal and a common source line signal. For example, memory cells 401, 403, 405, and 407 arranged on a first column may commonly receive a bit line signal BL1 while memory cells 402, 404, 406, and 408 arranged on a second column may commonly receive a bit line signal BL0. Memory cells 401 and 402 arranged on a row may commonly receive a word line signal WL3 at corresponding gate terminals and receive a source line signal SL1 at corresponding source terminals. Likewise, memory cells 403 and 404 arranged on a row may commonly receive a word line signal WL2 at corresponding gate terminals and receive source line signal SL1 at corresponding source terminals. Memory cells 405 and 406 arranged on a row may commonly receive a word line signal WL1 at corresponding gate terminals and receive a source line signal SL0 at corresponding source terminals while memory cells 407 and 408 arranged on a row may commonly receive a word line signal WL0 at corresponding gate terminals and receive source line signal SL0 at corresponding source terminals.

In an embodiment, memory cells positioned on adjacent rows of memory array 400 may be electrically coupled to receive a common source line signal. For example, memory cells 401 and 402 positioned on a first row and memory cells 403 and 404 positioned on a second row adjacent to the first row may be coupled to receive common source line signal SL1. Similarly, memory cells 405 and 406 positioned on a third row and memory cells 407 and 408 positioned on a fourth row adjacent to the third row may be coupled to receive common source line signal SL0. As with memory cell 100, memory cells 401, 402, 403, 404, 405, 406, 407, and 408 may include any type of memory technology known to a person of ordinary skill in the art that changes resistance as a function of applied voltage or current, e.g., RRAM, PCM, STT-MRAM, and the like. Significant cell size reductions of, e.g., 15-25% may result from memory array 400 in which memory cells positioned on adjacent rows share source line signals.

Figure 5A:
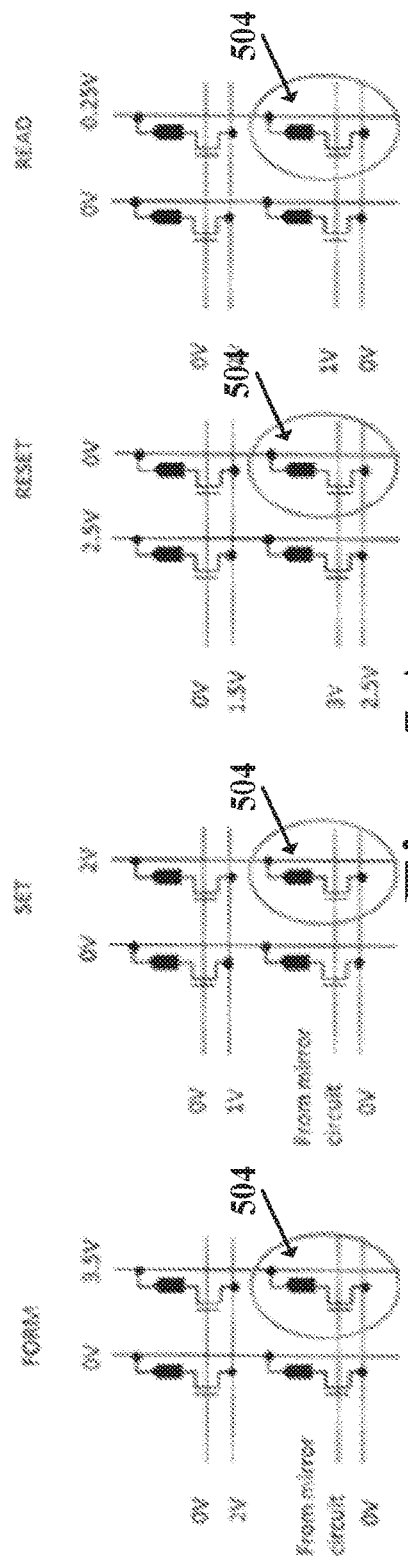
FIG. 5A are diagrams illustrating an embodiment of a method of biasing the portion of a 1T-1R memory array shown in FIG. 2 during form, set, reset, and read operations.

FIG. 5A are diagrams illustrating an embodiment of a method of operating the portion of memory array 200 shown in FIG. 2 during form, set, reset, and read operations to avoid punch-through or other undesirable effects. An exemplary bias scheme in which a memory cell 504 is selected for a form operation is shown in Table 1 above.

An exemplary bias scheme in which a memory cell 504 is selected for a set operation is shown in Table 2.

TABLE 2

| Set Operation | | |
|---|---|---|
| Selected bit line signal | BL0 | 2 V |
| Selected source line signal | SL0 | 0 V |
| Selected word line signal | WL0 | 1.5 V |
| Unselected bit line signal | BL1 | 0 V |
| Unselected source line signal | SL1 | 1 V |
| Unselected word line signal | WL1 | 0 V |

An exemplary bias scheme in which a memory cell 504 is selected for a reset operation is shown in Table 3.

TABLE 3

| Reset Operation | | |
|---|---|---|
| Selected bit line signal | BL0 | 0 V |
| Selected source line signal | SL0 | 2.5 V |
| Selected word line signal | WL0 | 3 V |
| Unselected bit line signal | BL1 | 2.5 V |
| Unselected source line signal | SL1 | 1.5 V |
| Unselected word line signal | WL1 | 0 V |

An exemplary bias scheme in which a memory cell 504 is selected for a read operation is shown in Table 4.

TABLE 4

| Read Operation | | |
|---|---|---|
| Selected bit line signal | BL0 | 0.25 V |
| Selected source line signal | SL0 | 0 V |
| Selected word line signal | WL0 | 1 V |
| Unselected bit line signal | BL1 | 0 V |
| Unselected source line signal | SL1 | 0 V |
| Unselected word line signal | WL1 | 0 V |

Figure 5B:
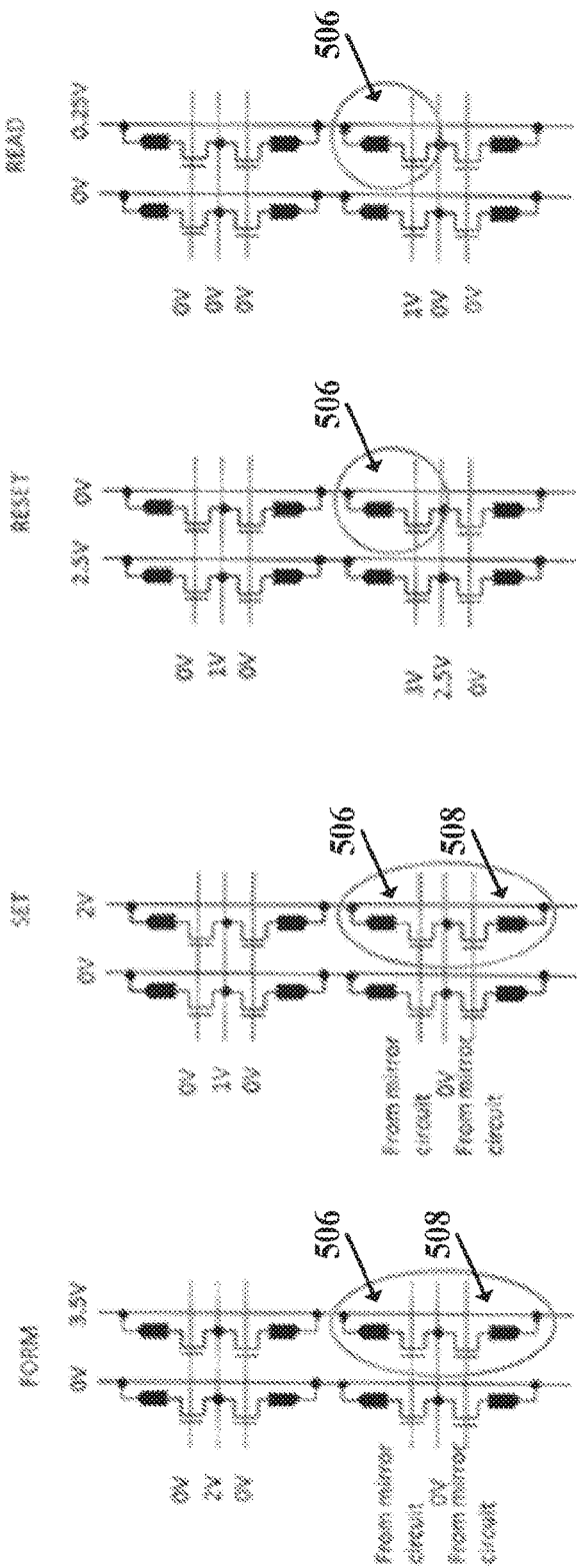
FIG. 5B are diagrams illustrating an embodiment of a method of biasing the portion of a 1T-1R memory array shown in FIG. 4 during form, set, reset, and read operations.

FIG. 5B are diagrams illustrating an embodiment of a method of biasing the portion of memory array 400 shown in FIG. 4 during form, set, reset, and read operations to avoid punch-through or other undesirable effects. For any byte to be written, a control circuit (not shown) may perform a set operation on all the memory cells corresponding to an addressed byte, and then only reset some of those memory cells (representing bits) based on the data to be written. Control circuit 410 may map addresses to allow a nearly simultaneous set and form operation performed on cells on adjacent rows.

An exemplary bias scheme in which memory cells 506 and 508 are selected for a form operation is shown in Table 5.

TABLE 5

| Form Operation | | |
|---|---|---|
| Selected bit line signal | BL0 | 3.5 V |
| Selected source line signal | SL0 | 0 V |
| Selected word line signal | WL0, WL1 | 1.5 V |
| Unselected bit line signal | BL1 | 0 V |
| Unselected source line signal | SL1 | 2 V |
| Unselected word line signal | WL2, WL3 | 0 V |

An exemplary bias scheme in which memory cells 506 and 508 are selected for a set operation is shown in Table 6.

TABLE 6

| Set Operation | | |
|---|---|---|
| Selected bit line signal | BL0 | 2 V |
| Selected source line signal | SL0 | 0 V |

TABLE 6-continued

Set Operation

| | | |
|---|---|---|
| Selected word line signal | WL0, WL1 | 1.5 V |
| Unselected bit line signal | BL1 | 0 V |
| Unselected source line signal | SL1 | 1 V |
| Unselected word line signals | WL2, WL3 | 0 V |

An exemplary bias scheme in which a memory cell 506 is selected for a reset operation is shown in Table 7.

TABLE 7

Reset Operation

| | | |
|---|---|---|
| Selected bit line signal | BL0 | 0 V |
| Selected source line signal | SL0 | 2.5 V |
| Selected word line signal | WL1 | 3 V |
| Unselected bit line signal | BL1 | 2.5 V |
| Unselected source line signal | SL1 | 1 V |
| Unselected word line signals | WL0, WL2, WL3 | 0 V |

An exemplary bias scheme in which a memory cell 506 is selected for a read operation is shown in Table 8.

TABLE 8

Read Operation

| | | |
|---|---|---|
| Selected bit line signal | BL0 | 0.25 V |
| Selected source line signal | SL0 | 0 V |
| Selected word line signal | WL1 | 1 V |
| Unselected bit line signal | BL1 | 0 V |
| Unselected source line signal | SL1 | 0 V |
| Unselected word line signals | WL0, WL2, WL3 | 0 V |

Figure 6A:
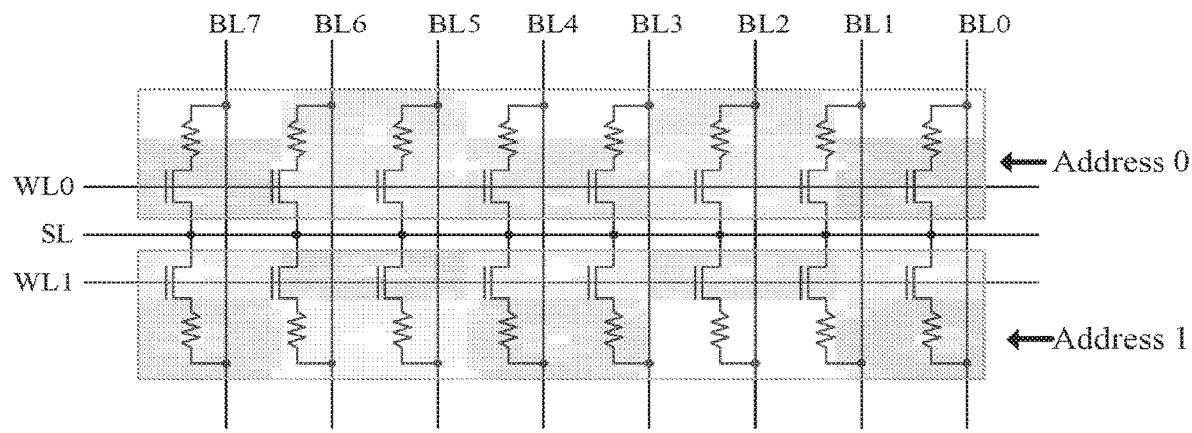
FIG. 6A is a diagram illustrating address mapping for an embodiment of a 1T-1R memory array.
Figure 6B:
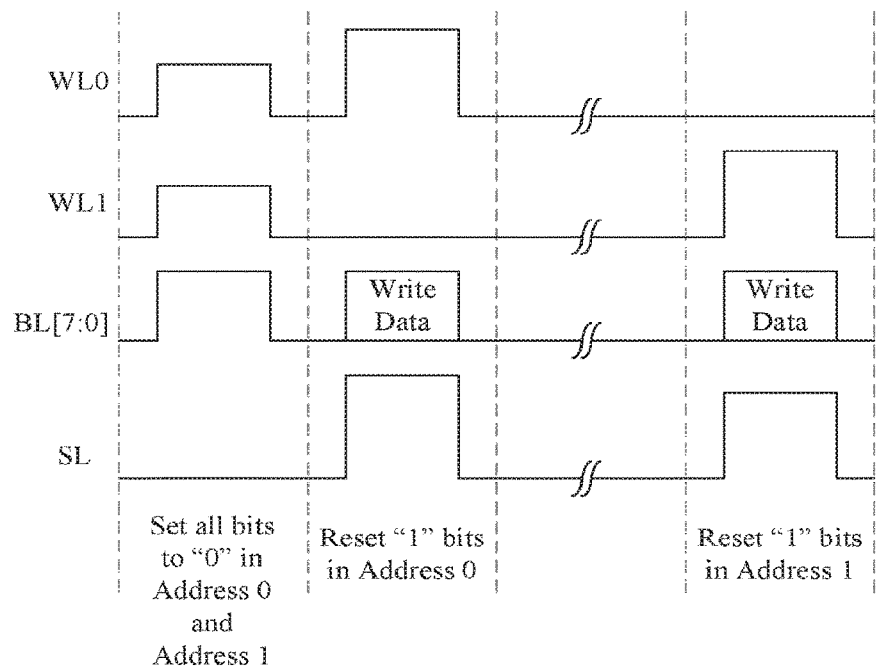
FIG. 6B is a timing diagram of signals used to write data to the 1T-1R memory array shown in FIG. 6A.

In an embodiment, control circuit 410 (FIG. 4) may map groups of memory cells in array 400 to address bytes as shown in FIGS. 6A and 6B. Control circuit 410 may map a group of eight memory cells corresponding to bit lines BL0 to BL7, word line signal WL0, and source line signal SL to address 0. Similarly, control circuit 410 may map a group of eight memory cells corresponding to bit lines BL0 to BL7, word line signal WL1, and source line signal SL to address 1. In an embodiment shown in FIG. 6A, memory cells mapped to address 0 may be positioned on eight adjacent columns of a first row of memory array 400 and memory cells mapped to address 1 may be positioned on the same eight adjacent columns but on a second row of memory array 400, where the first row is adjacent to the second row.

Referring to FIG. 6B, control circuit 410 may write data to memory cells in address 1 or address 0 by first setting all the bits in address 0 and address 1 to a first value, e.g., 0. Thereafter, control circuit 410 may reset bits in address 0 or address 1 to a second value, e.g., 1, based on the data. In an embodiment, control circuit 410 may reset bits in address 1 sequentially after resetting bits in address 0 based on the data.

Figure 7A:
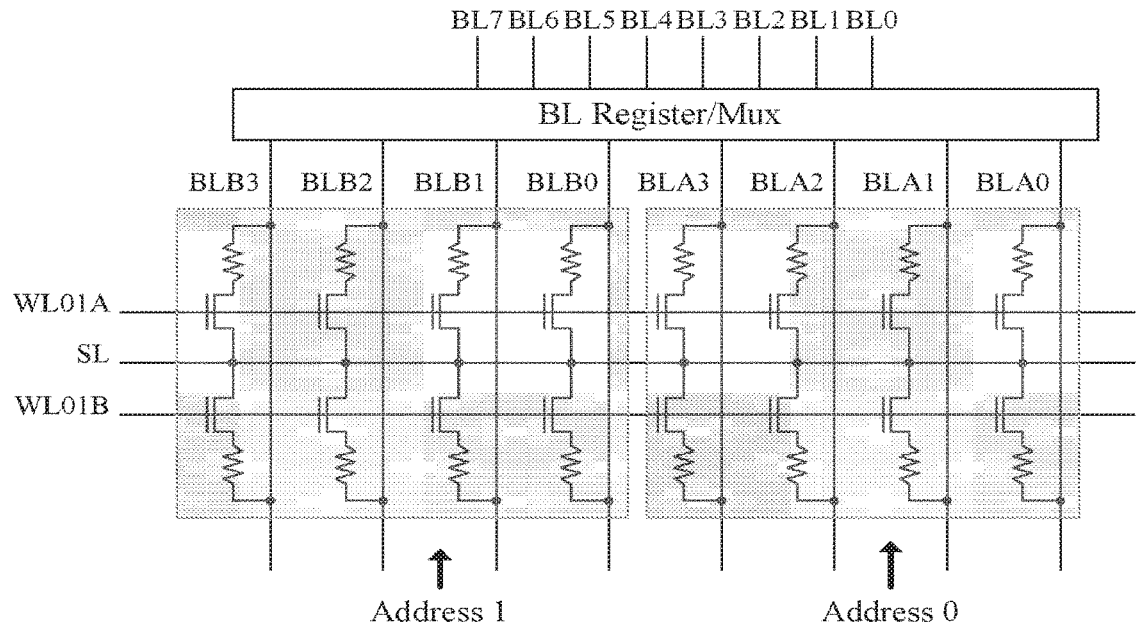
FIG. 7A is a diagram illustrating address mapping for an embodiment of a 1T-1R memory array.
Figure 7B:
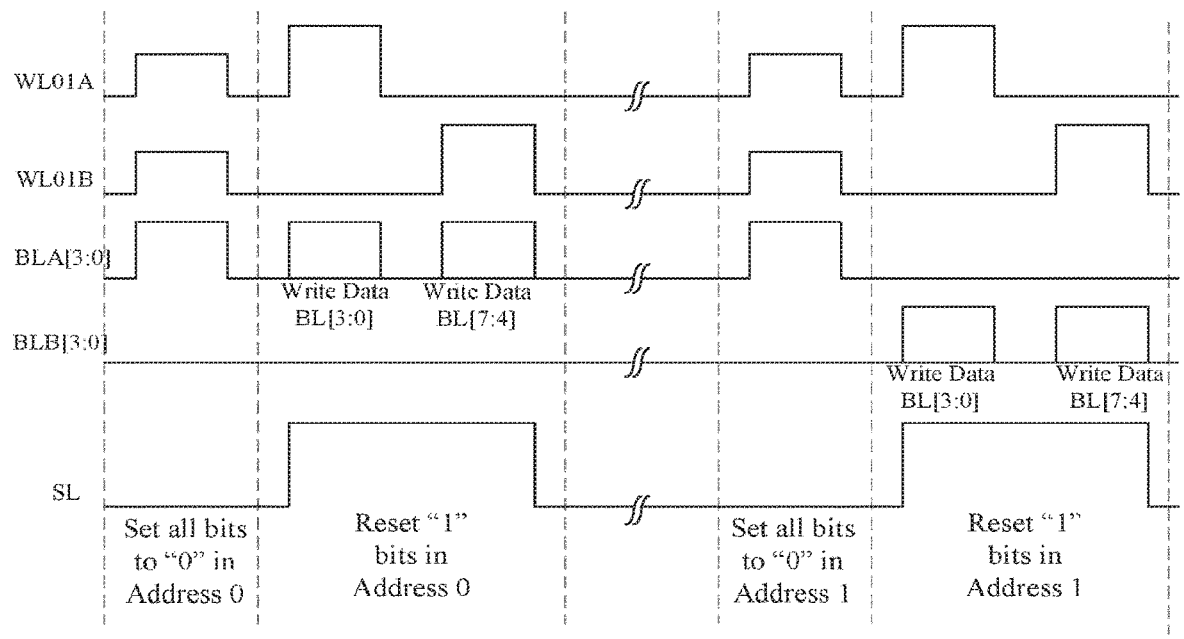
FIG. 7B is a timing diagram of signals used to write data to the 1T-1R memory array shown in FIG. 7A.

In another embodiment, control circuit 410 (FIG. 4) may map groups of memory cells in array 400 to address bytes as shown in FIGS. 7A and 7B. Control circuit 410 may map a first group of eight memory cells corresponding to first bit lines BLA0 to BLA3, word line signals WL01A and WL01B, and source line signal SL to address 0 and control circuit 410 may map a second group of eight memory cells corresponding to second bit lines BLB0 to BLB3, word line signals WL01A and WL01B, and source line signal SL to address 1. In an embodiment shown in FIG. 7A, memory cells in the first group of eight memory cells mapped to address 0 may be positioned on a first group of four adjacent columns on two adjacent rows and memory cells mapped to address 1 may be positioned on a second group of four adjacent columns on the two adjacent rows. A bit line register and multiplexer 712 may multiplex bit lines BL0 to BL7 from control circuit 410 to generate bit line signals BLA0 to BLA3 or bit line signals BLB0 to BLB3 to select memory cells in address 0 or address 1, respectively.

Referring to FIG. 7B, control circuit 410 may write data to memory cells in address 0 by first setting all the bits in address 0 to a first value, e.g., 0 and then resetting bits in address 0 to a second value, e.g., 1, based on the data. Note that control circuit 410 may first reset bits in memory cells mapped to address 0 corresponding to bit line signals BL[3:0] before resetting bits in memory cells corresponding to bit lines signals BL[7:4]. Similarly, control circuit 410 may write data to memory cells in address 1 by first setting all the bits in address 1 to a first value, e.g., 0 and then resetting bits in address 1 to a second value, e.g., 1, based on the data. Control circuit 410 may first reset bits in memory cells mapped to address 1 corresponding to bit line signals BL[3:0] before resetting bits in memory cells corresponding to bit lines signals BL[7:4].

FIG. 8A is a diagram of an embodiment of a voltage signal sequence applied to a portion of a memory array during a form operation. FIG. 8B is a timing diagram of an embodiment of the voltage signal sequence applied to the portion of the 1T-1R memory array shown in FIG. 8A during the form operation. A form operation is typically performed once on a memory cell during its manufacture. In an embodiment in which a form operation is performed substantially simultaneously on selected memory cells 806 and 808, control circuit 410 (FIG. 4) may apply the sequence of voltage signals as follows:

At step 1, charge unselected source line signal SL1 to an intermediate voltage to avoid punch-through, e.g., to 2V (hold selected source line signal SL0 at 0V).

Figure 12:
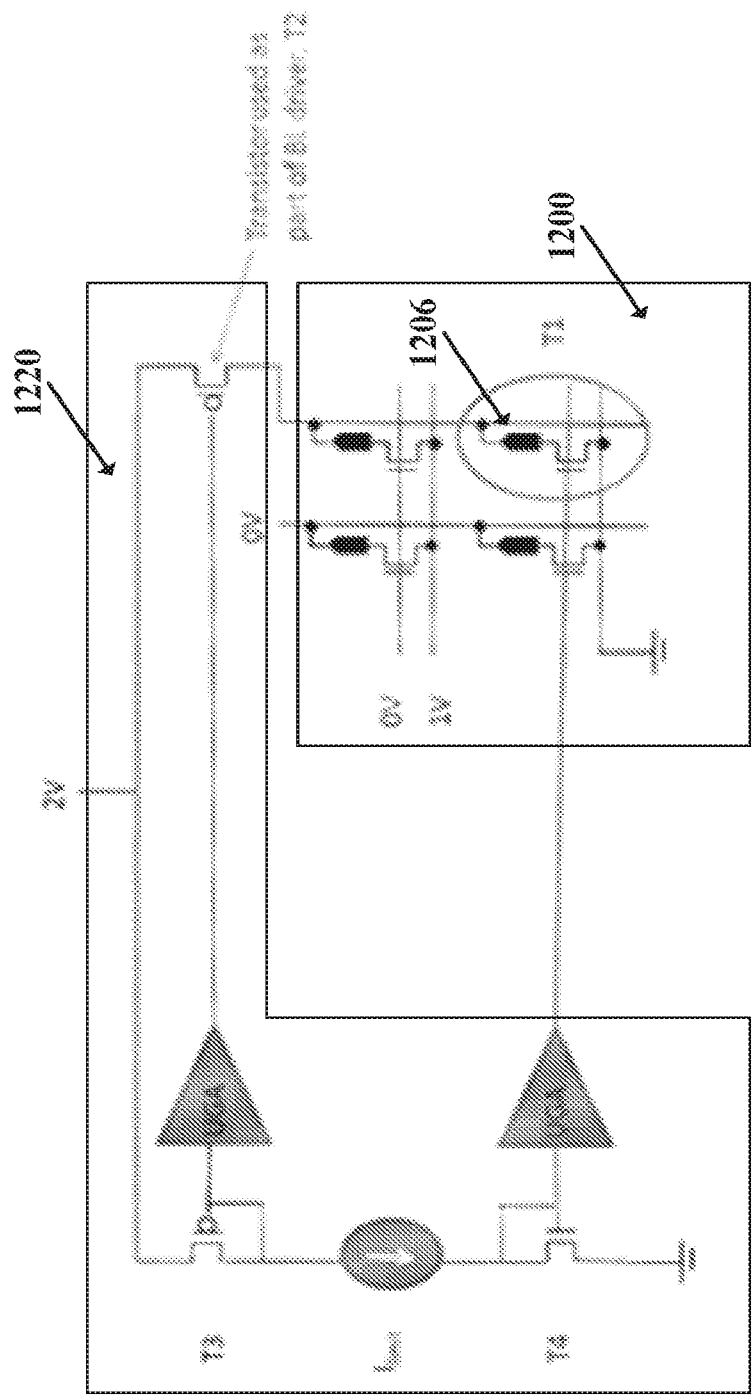
FIG. 12 is a diagram of an embodiment of a 1T-1R memory array including an embodiment of current limiting selector circuit.

At step 2, charge selected word line signals WL1 and WL0 to $V_{MIRROR}$, e.g., to 0.75V (hold unselected word line signals WL2 and WL3 to 0V). $V_{MIRROR}$ may be generated by a current control circuit included in a control circuit 410 (FIG. 4) to limit the current through the resistive element to avoid over programming and the local heating of such that can degrade long term reliability of the resistive element. FIG. 12 shows an exemplary current control circuit that is described in more detail below.

At step 3, charge selected bit line signal BL0 to $V_{FORM}$, e.g., 3.5V (hold unselected bit line signal BL1 to 0V).

At step 4, hold voltages in steps 1 to 3 during a form operation for a time $t_{FORM}$ for bit cells corresponding to selected word line signals WL0 and WL1 and selected bit line signal BL0.

At step 5, discharge selected bit line signal BL0.

At step 6, discharge unselected source line signal SL1.

At step 7, discharge selected word line signals WL0 and WL1.

FIG. 9A is a diagram of an embodiment of a voltage signal sequence applied to a portion of a memory array during a set operation. FIG. 9B is a timing diagram of an embodiment of the voltage signal sequence applied to the portion of the 1T-1R memory array shown in FIG. 9A during the set operation. In an embodiment in which a set operation is performed substantially simultaneously on selected memory cells 906 and 908, control circuit 410 (FIG. 4) may apply the sequence of voltage signals as follows:

At step 1, charge unselected source line signals SL1 to $V_{DD}$, e.g., 1.5V (hold selected source line signal SL0 to 0V).

At step 2, charge selected word line signals WL1 and WL0 to $V_{MIRROR}$, e.g., to 0.75V (hold unselected word line signals WL2 and WL3 to 0V).

At step 3, charge selected bit line signal BL0 to $V_{SET}$, e.g., 2V (hold unselected bit line signal BL1 to 0V).

At step 4, hold voltages in steps 1 to 3 during a set operation for a time $t_{SET}$ for bit cells corresponding to selected word line signals WL0 and WL1 and selected bit line signal BL0.

At step 5, discharge selected bit line signal BL0.

At step 6, discharge unselected source line signal SL0.

At step 7, discharge selected word line signals WL0 and WL1.

Figure 10A:
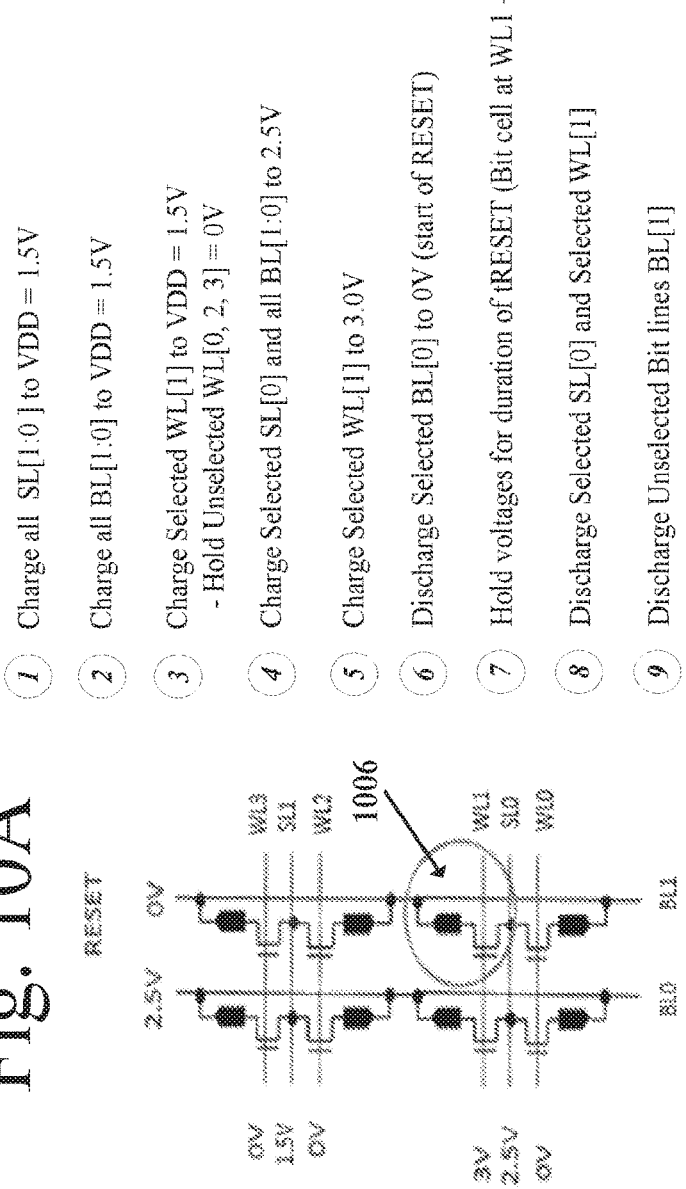
FIG. 10A is a diagram of an embodiment of a voltage signal sequence applied to a portion of a 1T-1R memory array during a reset operation.
Figure 10B:
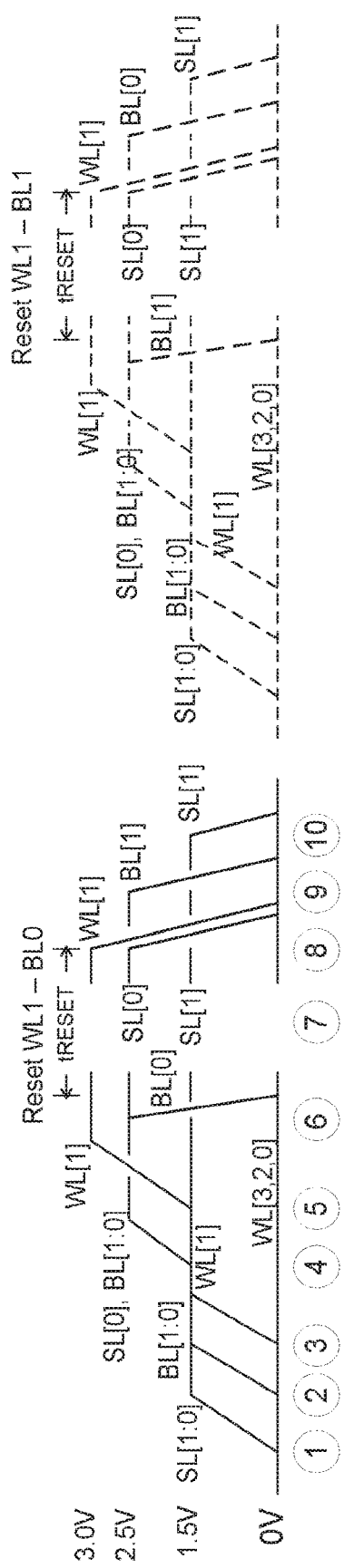
FIG. 10B is a timing diagram of an embodiment of the voltage signal sequence applied to the portion of the 1T-1R memory array shown in FIG. 10A during the reset operation.

FIG. 10A is a diagram of an embodiment of a voltage signal sequence applied to a portion of a memory array during a reset operation. FIG. 10B is a timing diagram of an embodiment of the voltage signal sequence applied to the portion of the 1T-1R memory array shown in FIG. 10A during the reset operation. In an embodiment in which a reset operation is performed substantially simultaneously on selected memory cell 1006, control circuit 410 (FIG. 4) may apply the sequence of voltage signals as follows:

At step 1, charge all source line signals SL0 and SL1 to $V_{DD}$, e.g., 1.5V.

At step 2, charge all bit line signals BL0 and BL1 to $V_{DD}$, e.g., 1.5V.

At step 3, charge selected word line signal WL1 to $V_{DD}$, e.g., 1.5V (hold unselected word line signals WL0, WL2, and WL3 to 0V).

At step 4, charge selected source line signal SL0 and bit line signals BL0 and BL1 to 2.5V.

At step 5, charge selected word line signal WL1 to 3V.

At step 6, discharge selected bit line signal BL0 to 0V (this step marks the start of the reset operation).

At step 7, hold voltages in steps 1 to 6 during a reset operation for a time $t_{RESET}$ for bit cells corresponding to selected word line signal WL1 and selected bit line signal BL0.

At step 8, discharge selected source line signal SL0 and selected word line signals WL1.

At step 9, discharge unselected bit line signal BL1.

At step 10, discharge unselected source line signal SL1.

FIG. 11A is a diagram of an embodiment of a voltage signal sequence applied to a portion of a memory array during a read operation. FIG. 11B is a timing diagram of an embodiment of the voltage signal sequence applied to the portion of the 1T-1R memory array shown in FIG. 11A during the read operation. In an embodiment in which a read operation is performed substantially simultaneously on selected memory cell 1106, control circuit 410 (FIG. 4) may apply the sequence of voltage signals as follows:

At step 1, charge selected bit line signal BL0 to $V_{BL}$, e.g., 0.25V (hold unselected bit line signal BL1 to 0V).

At step 2, charge selected word line signal WL1 to $V_{DD}$, e.g., 1.5V (hold all unselected word line signals WL0, WL2, and WL3 to 0V).

At step 3, develop bit line signal during a read operation for a time $t_{READ}$ for bit cell corresponding to selected word line signal WL1 and selected bit line signal BL0.

At step 4, discharge selected word line signal WL1.

At step 5, discharge selected bit line signal BL0.

FIG. 12 is a diagram of an embodiment of a 1T-1R memory array 1200 including an embodiment of bit line current control circuit 1220. Memory array 1200 may similar to memory array 200 including a plurality of columns extending in a first direction and a plurality of rows extending in a second direction perpendicular to the first direction. In an embodiment of array 1200, a column of memory cells is coupled to receive a common bit line signal while a row of memory cells is coupled to receive a common word line signal and a common source line signal as described previously in relation to memory array 200. In an embodiment, bit lines in memory array 1200 may be coupled to a bit line control circuit 1220 configured to control current provided to the plurality of resistive memory cells. Bit line control circuit 1220 may include transistors T2, T3, and T4 configured to form a current mirror with selected memory cells. In this configuration, the specific voltage that will appear on the bit line line may vary as a function of the voltage threshold of the select transistor in selected memory cell 1206. If the voltage threshold is low, the bit line may rise (charged by the cell current) until the normalized saturation drain current of the select transistor TI matches the saturation drain current of the bit line transistor T2. According, the variation of a threshold voltage of the cell select transistor T1 (in an advanced Complementary Metal Oxide Semiconductor (CMOS) process where the variation in transistor threshold voltage from device to device can be relatively large, for example 150-200 mV) may be addressed by the self-compensating effect of the current mirror configuration between the select transistor T1 and transistors T2, T3, and T4.

During a form or set operation, transistor T2 may limit the current flowing through selected memory cell 1206 to lower variability and improve bit yield and power consumption. Mismatch issues are avoided since driver transistors T2, T3, and T4 are typically larger in area than the select transistor T1 included in memory cell 1206. In an embodiment, transistors T2, T3, and T4 may be Metal Oxide Semiconductor (MOS) transistors.

It will also be appreciated by persons of ordinary skill in the art that the present disclosure is not limited to what has been particularly shown and described hereinabove. Rather, the scope of the present disclosure includes both combinations and sub-combinations of the various features described hereinabove as well as modifications and variations which would occur to such skilled persons upon reading the foregoing description. Thus the disclosure is limited only by the appended claims.

What is claimed is:

1. A memory device comprising:
   an array of memory cells arranged in a plurality of columns in a first direction and a plurality of rows in a second direction, wherein each memory cell in the array comprises:
   a select transistor, wherein a source terminal of the select transistor is coupled to a source line, and wherein a gate terminal of the select transistor is coupled to a word line, and
   a memory element coupled in series with the select transistor, wherein a first end of the memory element is coupled to a drain terminal of the select transistor, and wherein a second end of the memory element is coupled to a bit line; and
   a control circuit configured to provide an unselected source line voltage to source lines of unselected memory cells before providing a selected word line voltage to a word line of a selected memory cell.

2. The memory device of claim 1, wherein:
   each memory cell in one of the plurality of columns shares a common bit line; and
   each memory cell in one of the plurality of rows shares a common word line and a common source line.

3. The memory device of claim 1, wherein:
memory cells positioned on adjacent rows of the array are electrically coupled to receive a common source line signal.

4. The memory device of claim 1, wherein:
the control circuit is further configured to generate source line signals, word line signals and bit line signals to control operation of the array.

5. The memory device of claim 4, wherein:
the control circuit is further configured to apply a selected source line voltage to a selected source line corresponding to the selected memory cell.

6. The memory device of claim 1, wherein:
the unselected source line voltage is different from the selected source line voltage.

7. The memory device of claim 6, wherein the unselected source line voltage is higher than the selected source line voltage.

8. The memory device of claim 1, wherein the unselected source line voltage is lower than a selected bit line voltage.

9. A method comprising:
selecting a memory cell of an array of memory cells;
applying an unselected source line voltage to unselected source lines of unselected memory cells that are not selected for an operation;
applying a selected source line voltage to a selected source line of the selected memory cell after applying the unselected source line voltage to the unselected source lines, wherein the unselected source line voltage is different from the selected source line voltage;
applying a selected word line voltage to a selected word line of the selected memory cell; and
performing the operation on the selected memory cell.

10. The method of claim 9, wherein:
the unselected source line voltage is higher than the selected source line voltage.

11. The method of claim 9, wherein:
the unselected source line voltage is lower than a selected bit line voltage.

12. The method of claim 9, wherein each memory cell in the array comprises:
a select transistor, wherein a source terminal of the select transistor is coupled to a source line, and wherein a gate terminal of the select transistor is coupled to a word line; and
a memory element coupled in series with the select transistor, wherein a first end of the memory element is coupled to a drain terminal of the select transistor, and wherein a second end of the memory element is coupled to a bit line.

13. The method of claim 12, wherein:
each memory cell in one of a plurality of columns in the array shares a first common bit line; and
each memory cell in one of a plurality of rows in the array shares a first common word line and first common source line.

14. A memory device, comprising:
a plurality of word lines;
a plurality of source lines;
a plurality of bit lines;
an array of resistive memory cells, each resistive memory cell in the array comprising:
a select transistor, wherein a source terminal of the select transistor is coupled to one of the plurality of source lines, and wherein a gate terminal of the select transistor is coupled to one of the plurality of word lines, and
a memory element coupled in series with the select transistor, wherein a first end of the memory element is coupled to a drain terminal of the select transistor, and wherein a second end of the memory element is coupled to one of the plurality of bit lines; and
a control circuit configured to provide an unselected source line voltage to source lines of unselected resistive memory cells before providing a selected word line voltage to a word line of a selected resistive memory cell.

15. The memory device of claim 14, wherein:
the control circuit is further configured to provide a selected source line voltage to a source line of the selected resistive memory cell.

16. The memory device of claim 15, wherein:
the unselected source line voltage is different from the selected source line voltage.

17. The memory device of claim 16, wherein the unselected source line voltage is higher than the selected source line voltage.

18. The memory device of claim 14, wherein the unselected source line voltage is lower than a selected bit line voltage.

19. The memory device of claim 14, wherein:
the resistive memory cells of the array are arranged in a plurality of columns in a first direction and a plurality of rows in a second direction.

20. The memory device of claim 19, wherein:
each resistive memory cell in one of the plurality of columns shares a common bit line; and
each memory cell in one of the plurality of rows shares a common word line and a common source line.

* * * * *